US008506771B2

(12) United States Patent
Horishita et al.

(10) Patent No.: US 8,506,771 B2
(45) Date of Patent: *Aug. 13, 2013

(54) BIPOLAR PULSED POWER SUPPLY AND POWER SUPPLY APPARATUS HAVING PLURALITY OF BIPOLAR PULSED POWER SUPPLIES CONNECTED IN PARALLEL WITH EACH OTHER

(75) Inventors: Yoshikuni Horishita, Kanagawa (JP); Atsushi Ono, Kanagawa (JP); Wataru Oshima, Kanagawa (JP)

(73) Assignee: ULVAC, Inc., Kanagawa (JP)

( * ) Notice: Subject to any disclaimer, the term of this patent is extended or adjusted under 35 U.S.C. 154(b) by 240 days.

This patent is subject to a terminal disclaimer.

(21) Appl. No.: 12/989,692

(22) PCT Filed: May 20, 2009

(86) PCT No.: PCT/JP2009/059276
§ 371 (c)(1),
(2), (4) Date: Oct. 26, 2010

(87) PCT Pub. No.: WO2009/145094
PCT Pub. Date: Dec. 3, 2009

(65) Prior Publication Data
US 2011/0120860 A1 May 26, 2011

(30) Foreign Application Priority Data
May 26, 2008 (JP) ................................. 2008-137095

(51) Int. Cl.
*H01J 37/34* (2006.01)
(52) U.S. Cl.
USPC .................... 204/298.08; 363/98; 323/266
(58) Field of Classification Search
USPC .......... 204/298.06, 298.08; 323/266; 363/98
See application file for complete search history.

(56) References Cited

U.S. PATENT DOCUMENTS

| 5,303,139 | A | * | 4/1994 | Mark ............................. 363/63 |
| 5,698,082 | A | * | 12/1997 | Teschner et al. ......... 204/298.03 |
| 6,063,245 | A | * | 5/2000 | Frach et al. ............... 204/192.15 |
| 6,096,174 | A | * | 8/2000 | Teschner et al. ......... 204/192.12 |
| 6,340,416 | B1 | * | 1/2002 | Goedicke et al. ........ 204/192.12 |

* cited by examiner

FOREIGN PATENT DOCUMENTS

| JP | 61-154484 A | 7/1986 |
| JP | 06-113561 A | 4/1994 |
| JP | 2005-151779 A | 6/2005 |

OTHER PUBLICATIONS

International Search Report for PCT Patent App. No. PCT/JP2009/059276 (Jul. 28, 2009).

*Primary Examiner* — Rodney McDonald
(74) *Attorney, Agent, or Firm* — Cermak Nakajima LLP; Tomoko Nakajima

(57) ABSTRACT

A bipolar pulsed power supply which supplies power in a bipolar pulsed mode at a predetermined frequency to a pair of electrodes that come into contact with a plasma is arranged to reduce the switching loss of the switching elements in a bridge circuit, and also to attain a high durability without using high-performance switching elements. The bipolar pulsed power supply has: a bridge circuit constituted by switching elements SW1 through SW4 connected to positive and negative DC outputs from a DC power supply source; and a control means for controlling switching ON or OFF of each of the switching elements in the bridge circuit. An output-short-circuiting switching element SW0 is disposed between the positive and the negative DC outputs from the DC power supply source such that, in a short-circuited state of the output-short-circuiting switching element, each of the switching elements in the bridge circuit is switched by the control means.

9 Claims, 6 Drawing Sheets

BIPOLAR PULSED POWER SUPPLY AND POWER SUPPLY APPARATUS HAVING PLURALITY OF BIPOLAR PULSED POWER SUPPLIES CONNECTED IN PARALLEL WITH EACH OTHER

This application is a national phase entry under 35 U.S.C. §371 of PCT Patent Application No. PCT/JP2009/059276, filed on May 20, 2009, which claims priority under 35 U.S.C. §119 to Japanese Patent Application No. 2008-137095, filed May 26, 2008, both of which are incorporated by reference.

TECHNICAL FIELD

The present invention relates to a bipolar pulsed power supply which enables to supply bipolar pulsed power to a plasma- and surface-processing apparatus, and also relates to a power supply apparatus made up of a plurality of bipolar pulsed power supplies connected in parallel with each other.

BACKGROUND ART

This kind of bipolar pulsed power supply is used, for example, in a sputtering apparatus for forming a predetermined thin film on the surface of a substrate to be processed. There is known one which comprises: a rectifying circuit for supplying DC power; and a MOSFET bridge circuit which is connected to the positive and the negative output ends of the rectifying circuit and which is made up of four switching elements. Each of the switching elements is appropriately operated to thereby apply an arbitrary pulsed voltage to a pair of targets which are output ends (electrodes) by alternately switching polarity at a predetermined frequency. By thus switching the targets alternately to anode electrode and cathode electrode, glow discharge is caused to be generated between the anode electrode and the cathode electrode, and a plasma atmosphere is formed to sputter each of the targets. According to this arrangement, there is an advantage in that the electric charges to be accumulated on the surface of the targets are canceled by applying the voltage of opposite phase, thereby obtaining a stable electric discharge (see, e.g., patent document 1).

It is known that, during this kind of glow discharge, anomalous electric discharge (arcing) takes place for one cause or another. When arcing which is large in amount of current change (large in arc current) locally takes place between electrodes, there will be induced a problem of occurrence of splashes or particles, resulting in failure of good film forming. Therefore, in the above-mentioned bipolar pulsed power supply, there is provided a detection circuit which detects an output current from a bridge circuit. When the output current as detected by this detection circuit has exceeded a steady output current value, the switching element in operation is switched to thereby once cut off the output to the electrode in question. Once the overcurrent has calmed down and the output current value becomes near the steady output current value, the output to the electrode in question is resumed (see patent document 1). In other words, in this bipolar pulsed power supply, when the output current varies beyond a certain range, it is taken or recognized as a pre-stage phenomenon (micro-arc) of arcing. Then, by performing the processing of extinguishing the arcing, the generation of arcing that is large in the amount of current change can be suppressed.

Patent Document 1: Japanese patent No. 3,639,605 (see, e.g., claim 1, the description in paragraph No. 0016).

DISCLOSURE OF THE INVENTION

Problems to be Solved by the Invention

In the above-mentioned example, however, when an overcurrent flows through arcing at the beginning of sputtering when discharge is still not stabilized due to oxidation of targets and the like, or during sputtering, the four switching elements themselves are controlled at a high speed to cope with the problem. In other words, switching of each of the switching elements is performed in a state in which DC power is being supplied. Therefore, switching loss of the respective switching elements is large and there is a possibility that the malfunctioning takes place at an early stage depending on the service conditions. As a solution, it is necessary to use a switching element which is high in durability and which has a high switching speed. This solution will, however, bring about a higher cost.

In the conventional sputtering apparatus, there is one which makes possible the formation of a thin film on an object of large area such as a substrate to be used in manufacturing a FPD. In this kind of sputtering apparatus, it is normal practice to: dispose a plurality of targets of the same shape opposite to the substrate to be processed; to assign the above-mentioned bipolar pulsed power supply to targets that make respective pairs of targets, out of the plurality of targets disposed in parallel with each other; and to supply power to each of the targets by each of the bipolar pulsed power supplies which are capable of communication with one another.

However, the conventional bipolar pulsed power supply has four switching elements respectively. In addition, the switching elements have individual differences in switching speed (large-current switching elements have sometimes differences of maximum several μs), and the control circuit of each of the switching elements has also fluctuations in control speed. Therefore, the output from each of the bipolar pulsed power supplies fluctuates and the synchronized operation is difficult.

In view of the above-mentioned points, it is a first object of this invention to provide a bipolar pulsed power supply which is capable of reducing the switching loss in the switching elements of the bridge circuit, and which is capable of attaining a high durability without using a high-performance switching element. It is another object of this invention to provide a power supply apparatus which is made up of a plurality of bipolar pulsed power supplies which are easy in synchronization, the plurality of bipolar pulsed power supplies being disposed in parallel with each other.

Means for Solving the Problems

In order to solve the above-mentioned problems, the bipolar pulsed power supply according to claim 1 comprises: a bridge circuit made up of switching elements connected to positive and negative DC output ends from a DC power supply source; and a control means for controlling switching ON or OFF of each of the switching elements in the bridge circuit so that power is supplied at a predetermined frequency in a bipolar pulsed mode to a pair of electrodes that come into contact with a plasma. An output-short-circuiting switching element is disposed between the positive and the negative DC outputs from the DC power supply source such that, in a short-circuited state of the output-short-circuiting switching element, each of the switching elements in the bridge circuit is switched by the control means.

According to this invention, DC power is supplied from the DC power supply source to the bridge circuit. Then, in a state in which the output-short-circuiting switching element is kept short-circuited (ON), two switching elements that output to one of the electrodes, out of the switching elements to constitute the bridge circuit, are switched on. Thereafter, by releasing (OFF) the short-circuiting of the output-short-circuiting switching element, power is supplied (outputted) to the above-mentioned one electrode. Subsequently, the output-short-circuiting switching element is short-circuited once again to switch off the switching element that is outputting to the above-mentioned one electrode. At the same time, two switching elements that output to the other of the electrodes are switched on. Then, when the short-circuiting of the output-short-circuiting switching element is released, output is made to the other of the electrodes. By repeating the above-mentioned control, power is supplied to the pair of electrodes that come into contact with the plasma at a predetermined frequency in a bipolar pulsed mode.

At the time of supplying power in a bipolar pulsed mode, the switching loss is caused to occur only in one output-short-circuiting switching element. Therefore, there occurs little or no switching loss to each of the switching elements in the bridge circuit. As a result, a high durability can be attained without using high-performance switching elements. There is no need of heat radiating mechanism which would otherwise be required in case switching losses occur with four switching elements. Cost reduction in bipolar pulsed power supplies can thus be attained.

Preferably, the electrodes are a pair of targets disposed in a processing chamber for performing sputtering method therein.

Preferably, bipolar pulsed power supply further comprises: a detection means for detecting an output current between the pair of electrodes; and an arcing-detection means which recognizes as a pre-stage phenomenon of generation of arcing when an absolute value of the output current exceeds a steady output current value to the electrodes. When the pre-stage phenomenon of generation of arcing has been recognized by the arcing-detection means, output to the electrodes is cut off by the output-short-circuiting switching element to thereby perform a processing of extinguish the arcing. Then, as compared with the case in which the processing of arc extinguishing of an anomalous discharge is performed by controlling the two switching elements that are outputting, the controlling can be made with better response. Even during this processing, there will occur little or no switching loss to each of the switching elements in the bridge circuit, thereby further improving the durability thereof.

Further, in order to solve the above problems, the power supply apparatus according to claim 4 has a plurality of bipolar pulsed power supplies connected in parallel with each other, each of the bipolar pulsed power supplies being as defined in any one of claims 1 through 3. The power supply apparatus comprises a central control means for controlling switching ON or OFF of the output-short-circuiting switching element of each of the bipolar pulsed power supplies when power is supplied to a plurality of pairs of electrodes disposed in a same processing chamber.

According to this invention, it is necessary to synchronize only the output-short-circuiting switching element in each of the bipolar pulsed power supplies through the central control means. It is therefore possible to operate the switching elements in the bridge circuit with sufficient allowance. Even in case the switching elements in each of the bipolar pulsed power supplies and the control circuit have individual differences, their synchronized operation is easy.

Preferably, the timing of switching each of the switching elements in the bridge circuit is made changeable in a state in which the output-short-circuiting switching element of each of the bipolar pulsed power supplies is kept short circuited. Then, in case an arcing occurs between a pair of targets connected, e.g., to the same bipolar pulsed power supply, each of the switching elements in the bridge circuit can be controlled so that the potential of the targets adjacent to the targets that are causing the generation of arcing coincides with the potential of the targets having caused the arcing. The arcing can thus be advantageously extinguished.

Effects of the Invention

As explained hereinabove, the bipolar pulsed power supply of this invention has the effect in that the switching loss of the switching elements in the bridge circuit can be reduced and that high durability can be attained without using a high-performance switching element, resulting in a reduction in cost. Further, the power supply apparatus of this invention has an effect in that the synchronization of the output from each of the bipolar pulsed power supplies is easy.

BEST MODE FOR CARRYING OUT THE INVENTION

With reference to FIG. 1, reference character E denotes a bipolar pulsed power supply according to this invention. The bipolar pulsed power supply E is disposed opposite to a substrate S, e.g., inside a vacuum chamber of a sputtering apparatus, and is used to supply electric power in a bipolar pulsed mode at a predetermined frequency, to a pair of targets T1, T2 which are electrodes to come into contact with a plasma P. The bipolar pulsed power supply E is constituted by a DC power supply unit 1 which enables to supply DC power, and an oscillation unit 2 which controls the output (power supply) to each of the targets T1, T2. The waveform of the output voltage in this case may be substantially rectangular or substantially sinusoidal.

The DC power supply unit 1 has: a first CPU circuit 11 which controls the operation thereof; an input part 12 which receives an input of commercial AC power supply (three-phase AC 200V or 400V); and a rectifying circuit 13 which has six diodes 13a to rectify the inputted AC power to thereby convert it into DC power. Through positive and negative DC power lines 14a, 14b, DC power is outputted to the oscillation unit 2. The DC power supply unit 1 is provided with: a switching transistor 15 which is disposed between the DC power lines 14a, 14b; and a driver circuit 16 for output oscillation which is connected to the first CPU circuit 11 in a manner capable of communication therewith and controls ON or OFF of the switching transistor 15. Between the DC power lines 14a, 14b, there is connected a detection circuit 17a which detects the current and voltage thereof. The current and voltage detected by the detection circuit 17a are arranged to be inputted to the first CPU circuit 11 through an AD converter circuit 17a.

On the other hand, the oscillation unit 2 is provided with: a second CPU circuit 21 which is connected to the first CPU circuit 11 in a manner capable of communication therewith; a bridge circuit 22 which is made up of first through fourth, a total of four, switching transistors SW1 through SW4 which are connected between the positive and the negative DC power lines 14a, 14b; and a driver circuit 23 for output oscillation which is connected to the second CPU circuit 21 in a manner capable of communication therewith to control ON or OFF switching of each of the switching transistors SW1 through SW4.

When the driver circuit 23 for output oscillation controls the switching of each of the switching transistors SW1 through SW4 so that the ON-OFF timing, e.g., of the first and the fourth switching transistors SW1, SW4, and that of the second and the third switching transistors SW2, SW3 are reversed, power is supplied in a bipolar pulsed mode to a pair of targets T1, T2 through the output lines 24a, 24b from the bridge circuit 22. To the output lines 24a, 24b there is connected a detection circuit 25 which detects an output current and an output voltage supplied to the pair of targets T1, T2. The output current and the output voltage detected by this detection circuit 25 are arranged to be inputted to the second CPU circuit 11 through an AD conversion circuit 26.

In the above-mentioned bipolar pulsed power supply E, if each of the switching transistors SW1 through SW4 is switched in a state in which the DC power is outputted from the DC power supply unit 1, the switching losses thereof will become large. Therefore, it is necessary to arrange such that the durability of each of the switching transistors SW1 through SW4 is improved.

In this embodiment, the following arrangement has been employed. In other words, between the positive and the negative DC output lines 14a, 14b from the DC power supply unit 1, there is provided a switching transistor SW0 for short-circuiting the output (also called "output-short-circuiting switching transistor or element") whose ON-OFF switching is controlled by the driver circuit 23 for output oscillation. In a state of short-circuiting of the output-short-circuiting switching transistor SW0 (i.e., in a state in which the output to the targets T1, T2 is cut off), the switching of each of the switching transistors SW1 through SW4 in the bridge circuit 22 is made.

In other words, as shown in FIG. 2, in case power is supplied to a pair of targets T1, T2 in a bipolar pulsed mode, in a short-circuited state (ON) of the switching transistor SW0, e.g., the first and the fourth switching transistors SW1, SW4 are switched on. Thereafter, the short-circuiting of the switching transistor SW0 is released (OFF), and output is made to one T1 of the targets (negative potential is applied to the target T1). Subsequently, the switching transistor SW0 is once again short-circuited, and the first and the fourth switching transistors SW1, SW4 are switched off, and the second and the third switching transistors SW2, SW3 are switched on. Thereafter, the switching transistor SW0 is switched off and output is made to the other T2 of the targets (negative potential is applied to the target T2).

Then, by repeating the above-mentioned control in which the ON-OFF timing of each of the switching transistors SW1 through SW4 is reversed, power is supplied in a bipolar pulsed mode to the pair of targets T1, T2 at a predetermined frequency. According to this arrangement, in a state in which a sputtering gas such as Ar is introduced into a vacuum chamber that is held at a predetermined pressure, the targets T1, T2 that are charged with electric power at a predetermined frequency while alternately changing the polarity, are alternately switched to anode electrode and cathode electrode. Glow discharge occurs between the anode electrode and the cathode electrode and a plasma atmosphere is formed, whereby sputtering is performed on each of the targets T1, T2.

According to this arrangement, the switching loss that occurs at the time of outputting to the targets T1, T2 occurs only at the switching transistor SW0, and there occurs little or no switching loss to each of the switching transistors SW1 through SW4. As a result, without using a high-performance switching element, a high durability can be attained. Further, a sufficient heat radiating mechanism that would otherwise be required in the case in which the switching loss occurs in the four switching elements, becomes needless, whereby reduction in cost can be attained.

During the above-described glow discharge, there are cases where arcing may take place for some reason or other. Once arcing having a large arc current has occurred between a pair of targets T1, T2, there will be induced a problem of generation of splashes and particles, whereby good film forming cannot be done. As a solution, in this embodiment, there is provided an arc detection control circuit 27 which receives an input of the output current and the output voltage detected in the detection circuit 25, in a manner capable of communication with the second CPU circuit 21 (see FIG. 1) so that the processing of arc extinction can be performed.

As shown in FIGS. 3 and 4, when the output current Va detected by the detection circuit 25 has exceeded a steady output current value Vc, the arc detection control circuit 27 will take it as a pre-stage phenomenon of generation of arcing. The output-short-circuiting switching transistor SW0 is short-circuited (ON) by the driver circuit 23 for output oscillation, through the second CPU circuit 21 and the arc detection control circuit 27. In this case, each of the switching transistors SW1 through SW4 in the bridge circuit 22 is held in a state of outputting to one of the targets T1, T2. However, as a result of short-circuiting of the switching transistor SW0, the output to the targets T1, T2 will be cut off (micro-arc processing).

Then, after a lapse of predetermined period of time, short-circuiting of the output-short-circuiting switching transistor SW0 is released (OFF), and the output to either of the targets T1, T2 will be resumed depending on the operating conditions of each of the switching transistors SW1 through SW4. At this time, a judgment is made as to whether the output current Va has exceeded a steady output current value Vc or not. If the output current Va still exceeds the steady output current value Vc, output-short-circuiting switching transistor SW0 is short-circuited again by the driver circuit 23 for output oscillation.

Despite the series of micro-arc processing repeated several times, if the output current Va remains exceeding the steady output current value Vc, or if the output current Va has exceeded a predetermined set value that has been set in advance, it is judged to be the generation of arcing that induces the generation of splashes and particles. The transistor 15 is thus switched off by the control of the first CPU circuit 11, and the output from the DC power supply unit 1 is stopped (hard-arc processing).

By performing the micro-arc processing as described above, control can be made with better response than the case in which the processing of extinguishing the arcing by switching the two switching transistors SW1 through SW4 that are being outputted. Even during this processing, there will occur little or no switching loss to each of the switching transistors SW1 through SW4 in the bridge circuit 22, thereby further improving the durability.

With reference to FIGS. 5 and 6, a description will now be made of a power supply apparatus which is made up by connecting a plurality of bipolar pulsed power supplies E of this invention in parallel with each other. Reference characters ES denote the power supply apparatus according to this invention. This power supply apparatus ES is used, e.g., in a magnetron sputtering apparatus (hereinafter referred to as "sputtering apparatus") 3 having the arrangement as described below.

The sputtering apparatus 3 has a vacuum chamber 31 which can hold the pressure at a predetermined vacuum pressure (e.g., $10^{-5}$ Pa) through an evacuating means such as a rotary pump, a turbo-molecular pump and the like, and constitutes a sputtering chamber (processing chamber) 32. On an upper part of the vacuum chamber 31 there is provided a substrate holder 33 which holds, in potentially floating state, a large-area substrate S to be processed which is used in manufacturing, e.g., a FPD. The vacuum chamber 31 is also provided with a gas introduction pipe (not illustrated) for introducing a process gas into the sputtering chamber 32. There can be introduced into the processing chamber 32: a sputtering gas made from a rare gas such as Ar and the like; and a reactive gas such as $O_2$, $N_2$, $H_2O$ and the like to be appropriately selected depending on the composition of a thin film that is formed on a surface of the substrate S to be processed, at the time of forming a predetermined thin film by reactive sputtering.

In the sputtering chamber 32 there are disposed a plurality of (8 in this embodiment) targets 41a through 41h at an equal distance from one another opposite to the substrate S to be processed. Each of the targets 41a through 41h is manufactured, in a known method, of Al, Ti, Mo, oxides of indium and tin (ITO), an alloy of indium and tin, and the like depending on the composition of the thin film to be formed on the surface of the substrate S to be processed. They are formed into the same shape such as substantially into a rectangular parallelepiped (rectangle as seen in plan view).

Each of the targets 41a through 41h is combined through a bonding material such as indium, tin, and the like, to a backing plate which cools the targets 41a through 41h during sputtering. Each of the targets 41a through 41h is disposed in the vacuum chamber 31 through an insulating material such that the sputtering surface before use is positioned on the same plane parallel with the substrate S to be processed. On a rear side of the targets 41a through 41h (on the side which lies opposite to the sputtering surface), there is disposed a magnet assembly (not illustrated) having a known construction. By capturing the electrons ionized in front of each of the targets 41a through 41h and the secondary electrons generated by the sputtering, the density of electrons in front of each of the targets 41a through 41h is enhanced, thereby increasing the sputtering rate.

Each of the targets 41a through 41h is arranged to make a pair out of the adjoining two (41a and 41b, 41c and 41d, 41e and 41f, 41g and 41h). The bipolar pulsed power supplies E1 through E4 according to the embodiment of this invention are respectively disposed for assignment to the respective pairs of targets 41a through 41h. The output lines 24a, 24b from the bipolar pulsed power supplies E1 through E4 are connected to the respective pairs of targets 41a and 41b (41c and 41d, 41e and 41f, 41g and 41h). According to this arrangement, it becomes possible to supply each pair of the targets 41a through 41h with power whose polarity is alternately bipolar-pulsed.

In this embodiment, in order to stably generate a plasma in front of the targets 41a through 41h, the power is supplied by each of the bipolar pulsed power sources E1 through E4 synchronously so that the polarity of mutually adjoining targets 41a through 41h reverses relative to each other (see FIG. 5). For this synchronous operation there is provided a central control means 5 which is made up of a CPU connected to the second CPU circuit 21 of each of the bipolar pulsed power supplies E1 through E4 in a manner capable of communication therewith.

Then, in a short-circuited state of the output-short-circuiting switching transistor SW0 for output short-circuiting of each of the bipolar pulsed power supplies E1 through E4, each of the switching transistors SW1 through SW4 is operated so that the ON-OFF timing is reversed with the first and the fourth switching transistors SW1, SW4, and with the second and the third switching transistors SW2, SW3 for each of the bipolar pulsed power supplies E1 through E4, and so that the polarity of the mutually adjoining targets 41a through 41h is reversed. Thereafter, the short-circuiting of the switching transistor SW0 is released by the output from the central control means 5 so that output is made, out of a pair of targets, to one respective targets 41a, 41c, 41e, 41g.

Thereafter, by means of an output from the central control means 5, the output-short-circuiting switching transistor SW0 of each of the bipolar pulsed power supplies E1 through E4 is short-circuited. After switching each of the transistors SW1 through SW4, the short-circuiting of the switching transistor SW0 is released by an output from the central control means 5, and output is made to each of the other 41b, 41d, 41f, 41h of the targets. By thus repeating the above-mentioned control, each of the targets 41a through 41h is provided with power in a bipolar pulsed mode at a predetermined frequency, thereby performing synchronized operation.

At the time of this synchronized operation, it is necessary for the central control means 5 only to synchronize the timing of ON-OFF switching of the output-short-circuiting switching element SW0 of each of the bipolar pulsed power supplies E1 through E4. Therefore, the switching elements SW1 through SW4 of each of the bipolar pulsed power supplies E1 through E4 can be operated with sufficient allowance. Even if the switching element of each of the bipolar pulsed power supplies E1 through E4 and the control circuit has an individual difference, the synchronized operation thereof is easy.

Further, each of the bipolar pulsed power supplies E1 through E4 is arranged to perform the above-mentioned micro-arc processing in the following manner. In case, during sputtering, the output current Va as detected by the detection circuit 25 has exceeded the steady output current value Vc in any one of the bipolar pulsed power supplies, the micro-arc processing is performed by the switching of the output-short-circuiting switching transistor SW0 by the arc detection control circuit 23 in the bipolar pulsed power supply in question.

At the time of performing the micro-arc processing in any one of the bipolar pulsed power supplies, if the potential coincides with each other between a pair of targets to which the output cables 14a, 14b from the bipolar pulsed power supply and other targets to which the output power cables 14a, 14b from another bipolar pulsed power supply adjacent to the pair of targets, the arcing can be easily extinguished.

In this embodiment, the following arrangement has been employed. In other words, when micro-arc processing is started at any one of the bipolar pulsed power supplies E1 through E4, output is made to the second CPU circuit 21 of the bipolar pulsed power supply that is outputting to the adjoining targets through the central control means 5. In this case, the output-short-circuiting switching transistor SW0 is once short-circuited by the driver circuit 23 for output oscillation, through the second CPU circuit 21. Depending on the operating conditions of each of the switching transistors SW1 through SW4, the timing for operating each of the switching transistors SW1 through SW4 will be changed so that the potential coincides with each other. The short-circuiting of the output-short-circuiting switching transistor SW0 will be released and output is made to the targets.

In this embodiment, a description has been made of an example in which a central control means is provided in order to perform synchronized operation of each of the bipolar pulsed power supplies E1 through E4. However, an arrangement may be made such that any one of the second CPU circuit 21 is constituted as a central control means (master power supply) and that, by the output of this central control

DESCRIPTION OF REFERENCE NUMERALS AND CHARACTERS

Figure 1:
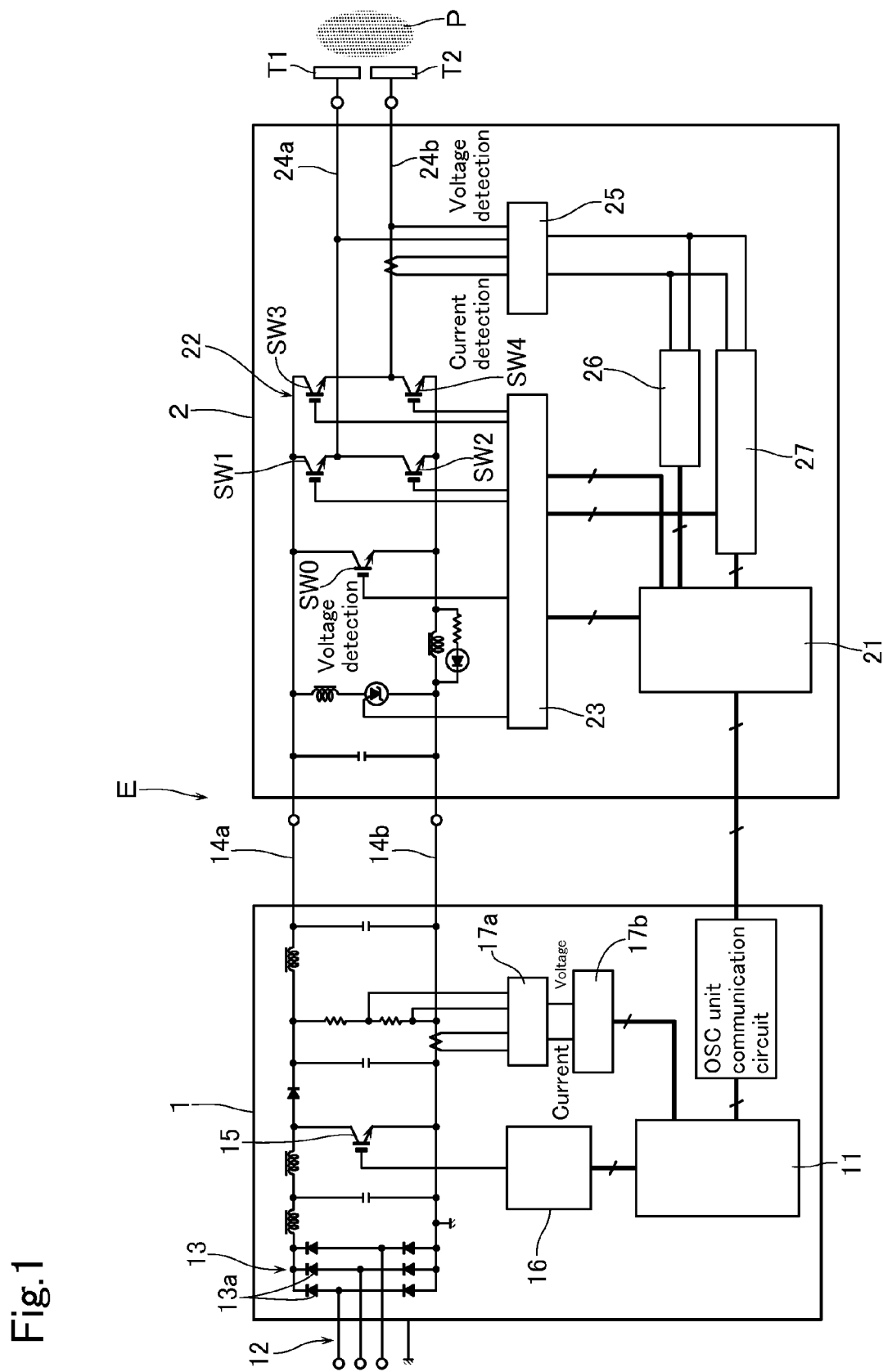
FIG. 1 is a block diagram schematically showing an arrangement of a bipolar pulsed power supply of this invention.
Figure 2:
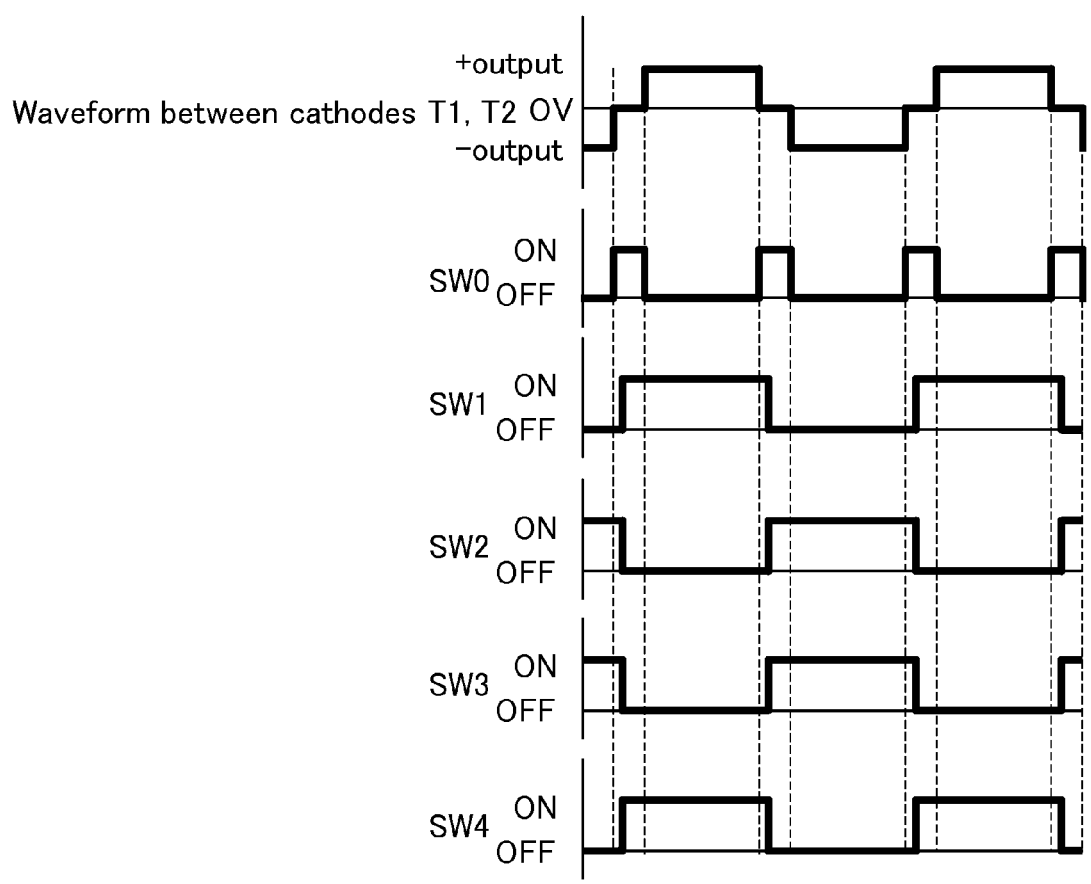
FIG. 2 is a diagram showing an output control of a bipolar pulsed power supply of this invention.
Figure 3:
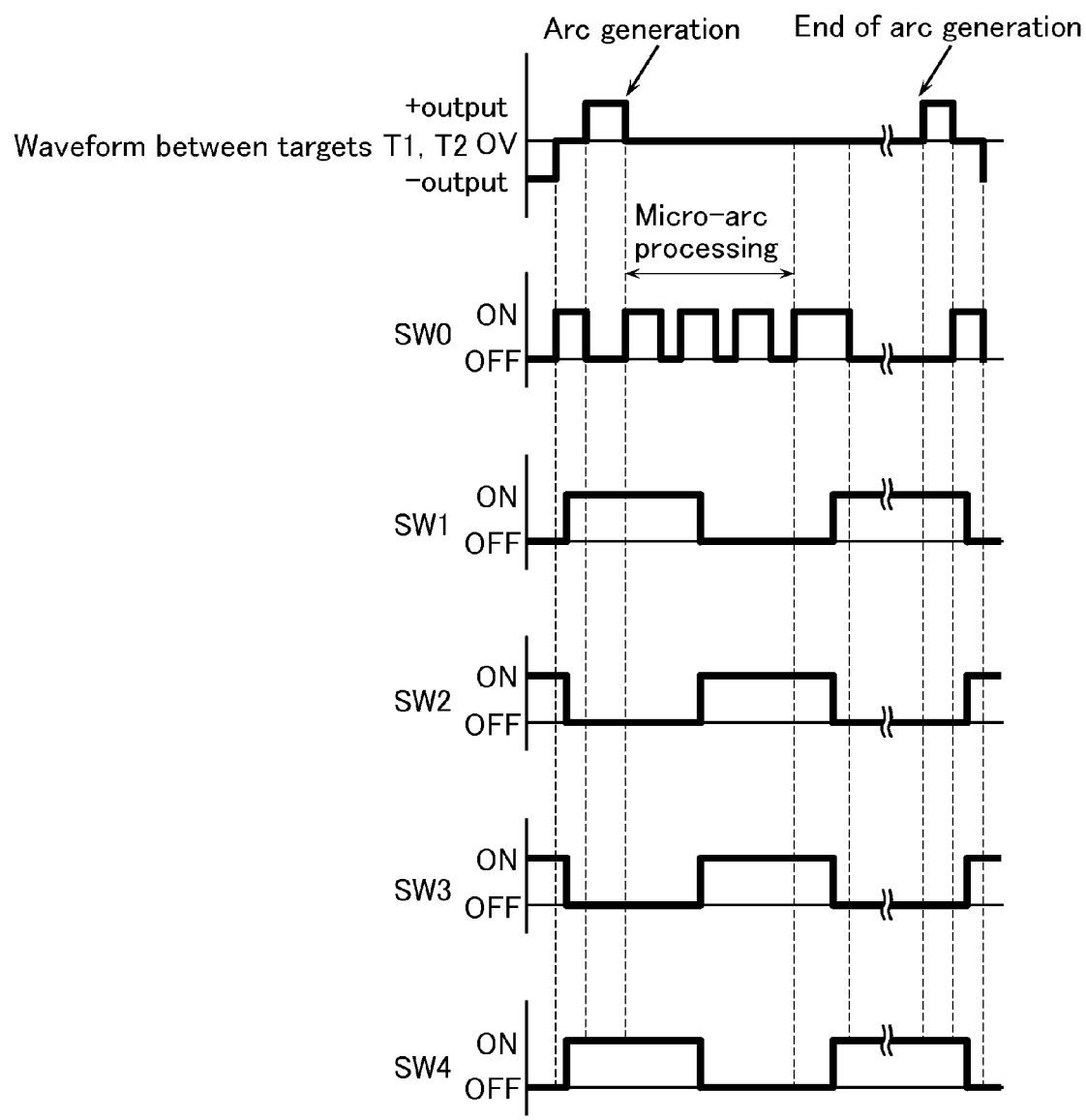
FIG. 3 is a diagram showing a micro-arc processing at the bipolar pulsed power supply of this invention.
Figure 4:
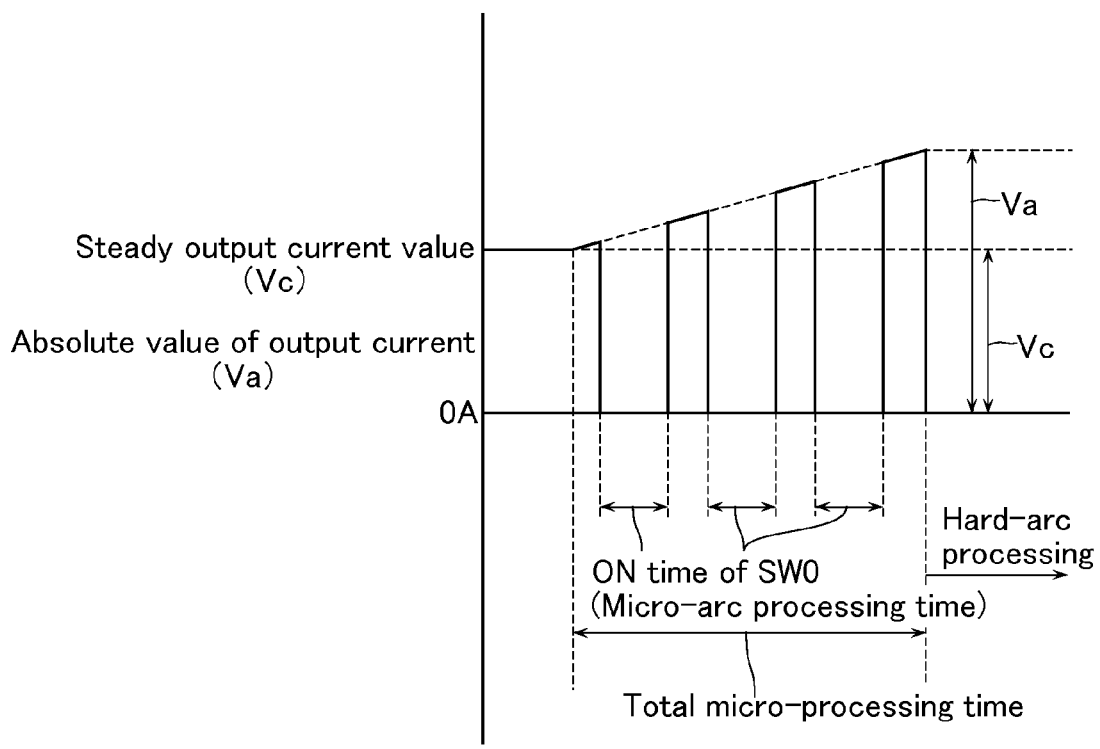
FIG. 4 is a diagram showing a micro-arc processing at the bipolar pulsed power supply of this invention.
Figure 5:
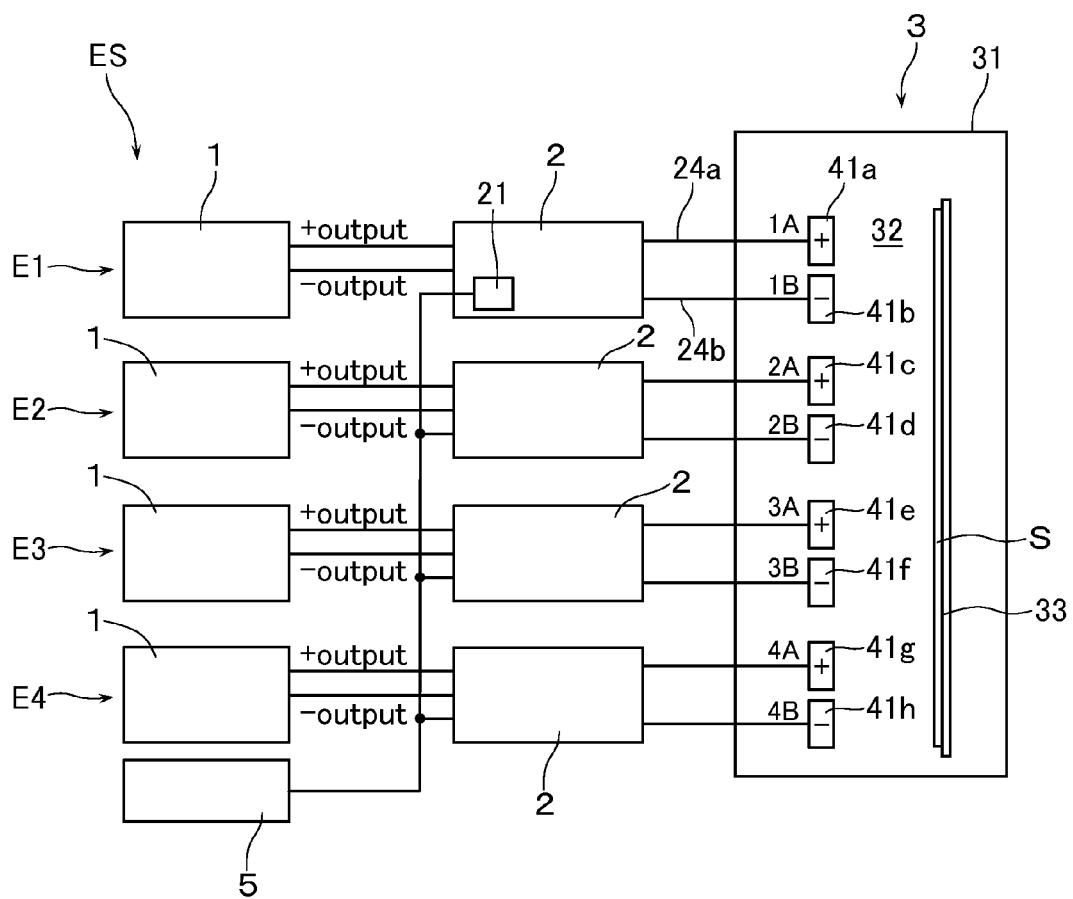
FIG. 5 is a block diagram schematically showing a sputtering apparatus of this invention.
Figure 6:
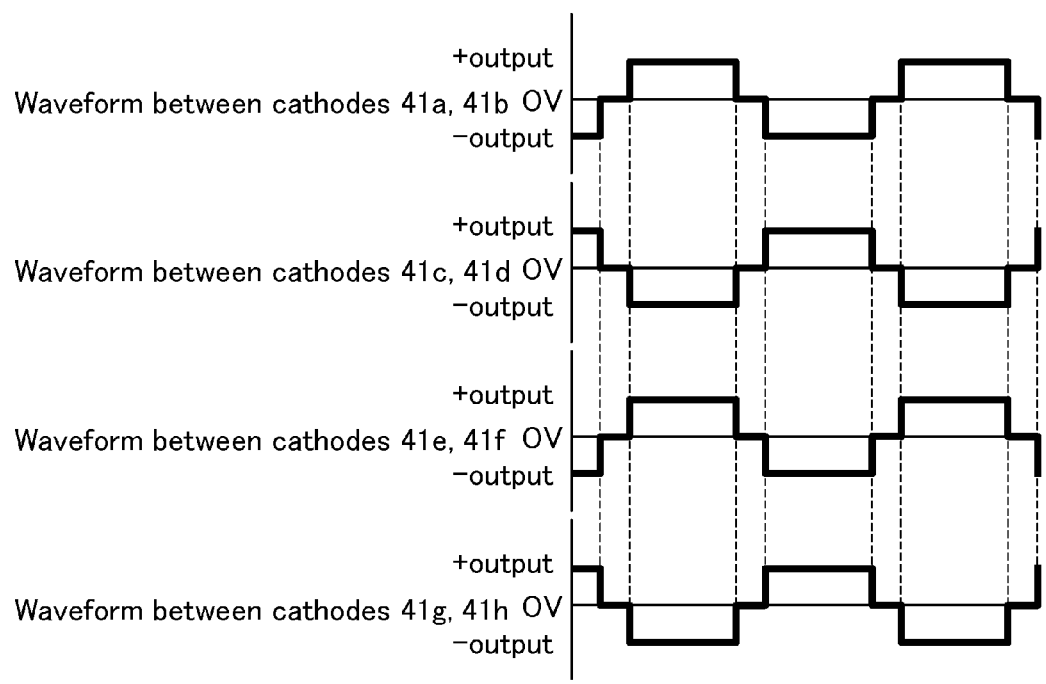
FIG. 6 is a diagram showing an output control of the power supply apparatus of this invention.

1 DC power supply unit
2 oscillation unit
22 bridge circuit
24*a*, 24*b* output cables
25 output current and voltage detection circuit
27 arc detection control circuit
E bipolar pulsed power supply
SW0 through SW4 switching elements
T1, T2 electrodes (targets)

What is claimed is:

1. A bipolar pulsed power supply comprising:
   a bridge circuit made up of switching elements connected to positive and negative DC output ends from a DC power supply source; and
   a control means for controlling switching ON or OFF of each of the switching elements in the bridge circuit so that power is supplied at a predetermined frequency in a bipolar pulsed mode to a pair of electrodes that come into contact with a plasma,
   wherein an output-short-circuiting switching element is disposed between the positive and the negative DC outputs from the DC power supply source, the output-short-circuiting switching element being configured to generate a short-circuited state, and each of the switching elements in the bridge circuit is switched by the control means during the short-circuited state generated by the output-short-circuiting switching element.

2. The bipolar pulsed power supply according to claim 1, wherein the electrodes are a pair of targets disposed in a processing chamber for performing sputtering method therein.

3. The bipolar pulsed power supply according to claim 1, further comprising:
   a detection means for detecting an output current between the pair of electrodes; and
   an arcing-detection means which recognizes as a pre-stage phenomenon of generation of arcing when an absolute value of the output current exceeds a steady output current value to the electrodes,
   wherein, when the pre-stage phenomenon of generation of arcing has been recognized by the arcing-detection means, output to the electrodes is cut off by the output-short-circuiting switching element to thereby perform a processing of extinguish the arcing.

4. A power supply apparatus having a plurality of bipolar pulsed power supplies connected in parallel with each other, each of the bipolar pulsed power supplies being as defined in claim 1, the power supply apparatus comprising a central control means for controlling switching ON or OFF of the output-short-circuiting switching element of each of the bipolar pulsed power supplies when power is supplied to a plurality of pairs of electrodes disposed in a same processing chamber.

5. A power supply apparatus according to claim 4, wherein the timing of switching each of the switching elements in the bridge circuit is made changeable in a state in which the output-short-circuiting switching element of each of the bipolar pulsed power supplies is kept short circuited.

6. The bipolar pulsed power supply according to claim 2, further comprising:
   a detection means for detecting an output current between the pair of electrodes; and
   an arcing-detection means which recognizes as a pre-stage phenomenon of generation of arcing when an absolute value of the output current exceeds a steady output current value to the electrodes,
   wherein, when the pre-stage phenomenon of generation of arcing has been recognized by the arcing-detection means, output to the electrodes is cut off by the output-short-circuiting switching element to thereby perform a processing of extinguish the arcing.

7. A power supply apparatus having a plurality of bipolar pulsed power supplies connected in parallel with each other, each of the bipolar pulsed power supplies being as defined in claim 2, the power supply apparatus comprising a central control means for controlling switching ON or OFF of the output-short-circuiting switching element of each of the bipolar pulsed power supplies when power is supplied to a plurality of pairs of electrodes disposed in a same processing chamber.

8. A power supply apparatus having a plurality of bipolar pulsed power supplies connected in parallel with each other, each of the bipolar pulsed power supplies being as defined in claim 3, the power supply apparatus comprising a central control means for controlling switching ON or OFF of the output-short-circuiting switching element of each of the bipolar pulsed power supplies when power is supplied to a plurality of pairs of electrodes disposed in a same processing chamber.

9. A power supply apparatus having a plurality of bipolar pulsed power supplies connected in parallel with each other, each of the bipolar pulsed power supplies being as defined in claim 6, the power supply apparatus comprising a central control means for controlling switching ON or OFF of the output-short-circuiting switching element of each of the bipolar pulsed power supplies when power is supplied to a plurality of pairs of electrodes disposed in a same processing chamber.

* * * * *